United States Patent
Blais et al.

(10) Patent No.: US 9,393,633 B2
(45) Date of Patent: Jul. 19, 2016

(54) METHOD OF JOINING A CHIP ON A SUBSTRATE

(75) Inventors: Pascal P Blais, Shefford (CA); Paul F Fortier, Richelieu (CA); Kang-Wook Lee, Yorktown Heights, NY (US); Jae-Woong Nah, Closter, NJ (US); Soojae Park, Wappingers Falls, NY (US); Robert L Toutant, Sainte-Paul (CA); Alain A Warren, Granby (CA)

(73) Assignee: GLOBALFOUNDRIES INC., Grand Cayman (KY)

( * ) Notice: Subject to any disclaimer, the term of this patent is extended or adjusted under 35 U.S.C. 154(b) by 917 days.

(21) Appl. No.: 12/551,960

(22) Filed: Sep. 1, 2009

(65) Prior Publication Data

US 2011/0049221 A1    Mar. 3, 2011

(51) Int. Cl.
| | |
|---|---|
| *B23K 20/00* | (2006.01) |
| *B23K 1/00* | (2006.01) |
| *H01L 21/56* | (2006.01) |
| *H01L 23/00* | (2006.01) |

(52) U.S. Cl.
CPC ............ *B23K 1/0016* (2013.01); *H01L 21/563* (2013.01); *H01L 24/75* (2013.01); *H01L 24/81* (2013.01); *H01L 2224/131* (2013.01); *H01L 2224/13099* (2013.01); *H01L 2224/73204* (2013.01); *H01L 2224/75704* (2013.01); *H01L 2224/75985* (2013.01); *H01L 2224/81005* (2013.01); *H01L 2224/8191* (2013.01); *H01L 2224/81191* (2013.01); *H01L 2224/81815* (2013.01); *H01L 2924/014* (2013.01); *H01L 2924/0105* (2013.01); *H01L 2924/01006* (2013.01); *H01L 2924/01019* (2013.01); *H01L 2924/01029* (2013.01); *H01L 2924/01033* (2013.01); *H01L 2924/01047* (2013.01); *H01L 2924/01076* (2013.01); *H01L 2924/01082* (2013.01); *H01L 2924/01322* (2013.01); *H01L 2924/10253* (2013.01); *H01L 2924/15787* (2013.01); *H01L 2924/3511* (2013.01)

(58) Field of Classification Search
CPC ............... B23K 2201/40; B23K 3/087; B23K 2201/42; B23K 37/0443; B23K 1/0016; B23K 1/008; B23K 37/04; B23K 37/0426
USPC .................................................. 228/213, 212
See application file for complete search history.

(56) References Cited

U.S. PATENT DOCUMENTS

| | | | |
|---|---|---|---|
| 5,862,588 A * | 1/1999 | Heim et al. ...................... 29/840 |
| 5,930,597 A * | 7/1999 | Call et al. ....................... 438/106 |
| 6,122,170 A * | 9/2000 | Hirose et al. .................. 361/704 |
| 6,189,210 B1 * | 2/2001 | Cox et al. ......................... 29/861 |
| 6,237,832 B1 * | 5/2001 | Chung ......................... 228/44.7 |
| 6,581,278 B2 * | 6/2003 | Kay .............................. 29/830 |
| 2002/0093080 A1 * | 7/2002 | Kay .............................. 257/678 |
| 2004/0011283 A1 * | 1/2004 | Gochnour et al. ............ 118/500 |

\* cited by examiner

*Primary Examiner* — Erin Saad
(74) *Attorney, Agent, or Firm* — Scully Scott Murphy and Presser

(57) ABSTRACT

A method and apparatus for making chip assemblies is disclosed that prevent or reduce the cracking and delamination of ultra low-k dielectrics in the back-end-of-line in Si chips that can occur during the chip assembly process. The method and apparatus apply pressure to the top and bottom surfaces of a substrate during the chip bonding process so that the bending and warping of the assembled modules are reduced. The reduced bending and warping prevent or reduce the cracking and delamination of ultra low-k dielectrics.

18 Claims, 19 Drawing Sheets

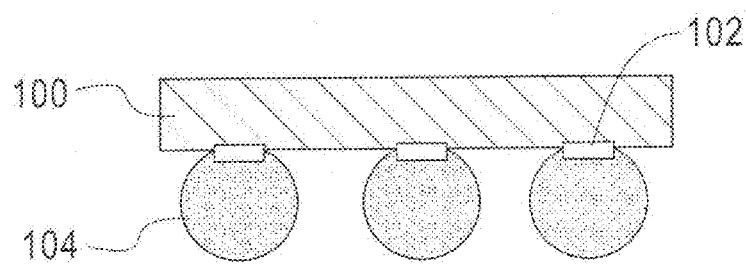
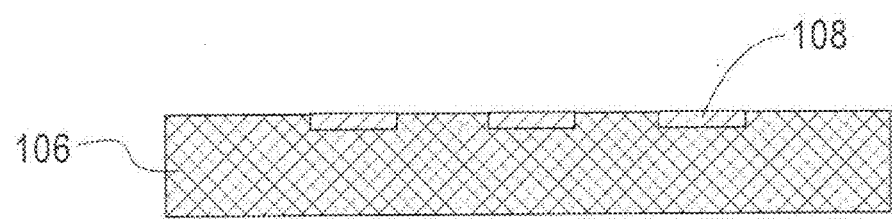
FIG. 1
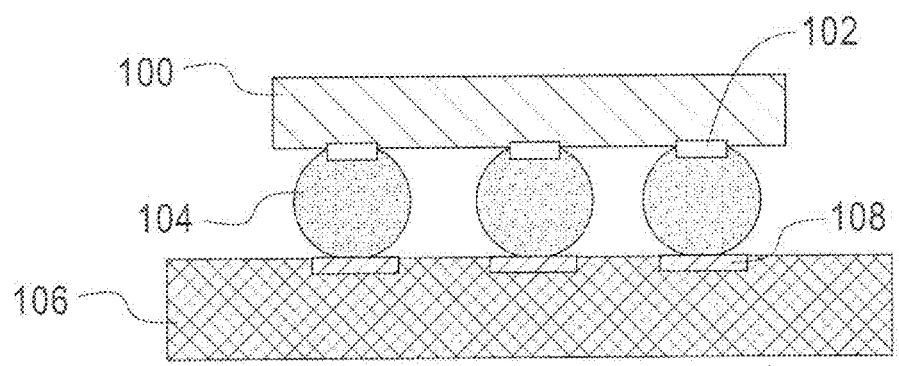
FIG. 2

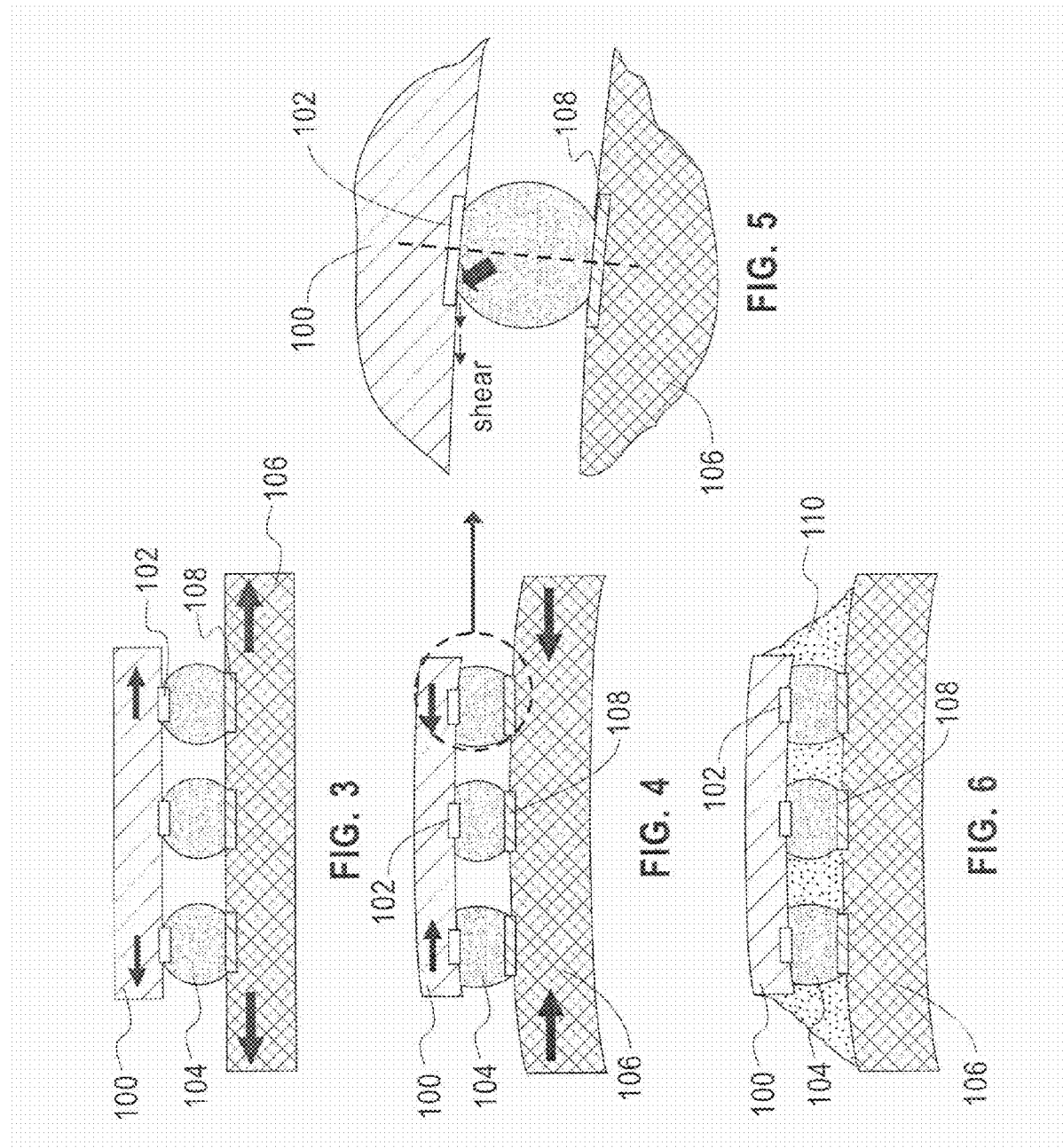

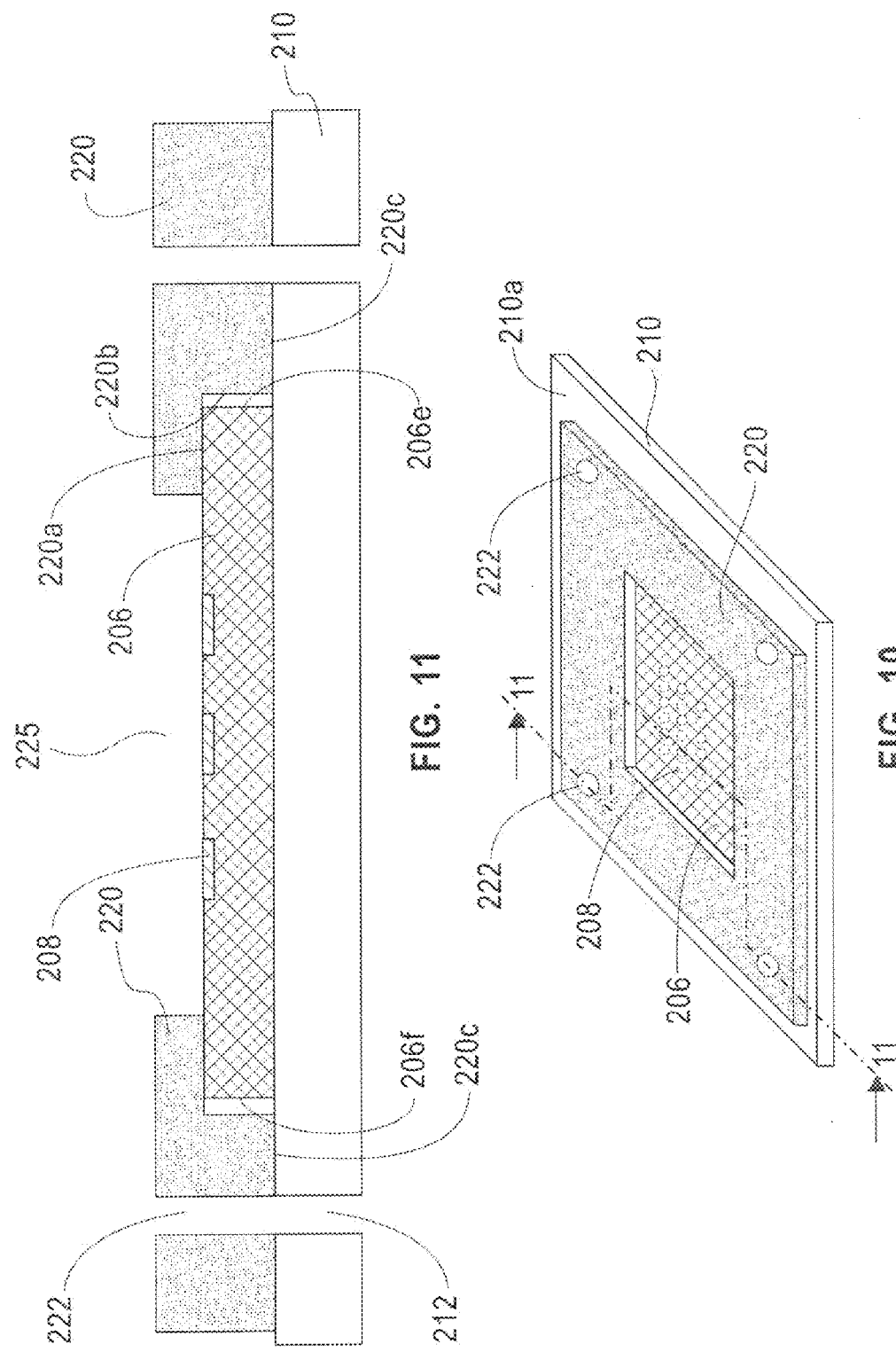

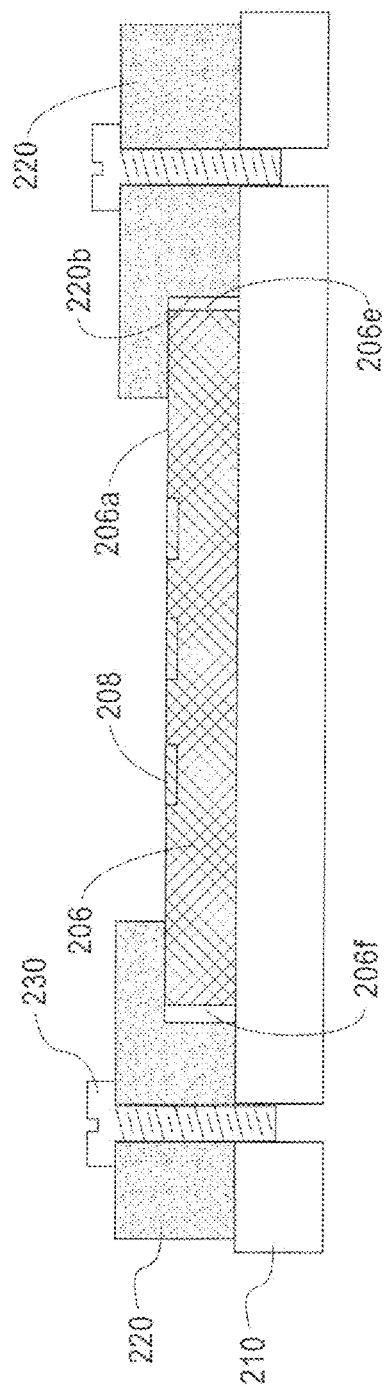
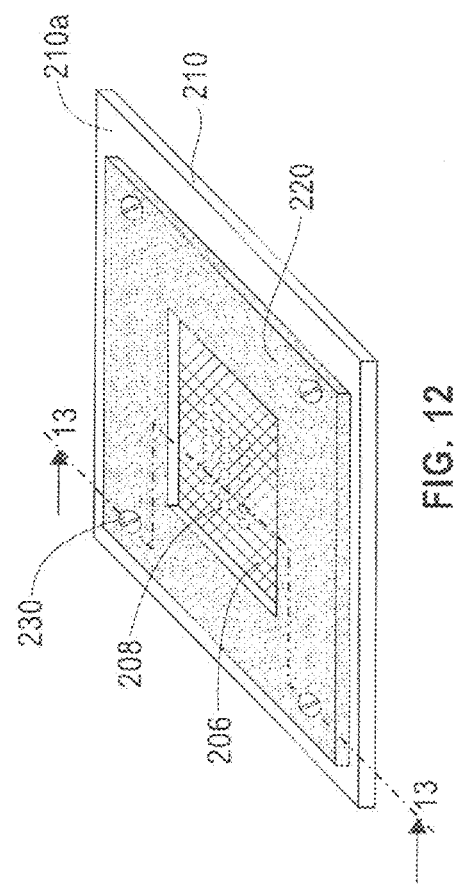
FIG. 13
FIG. 12

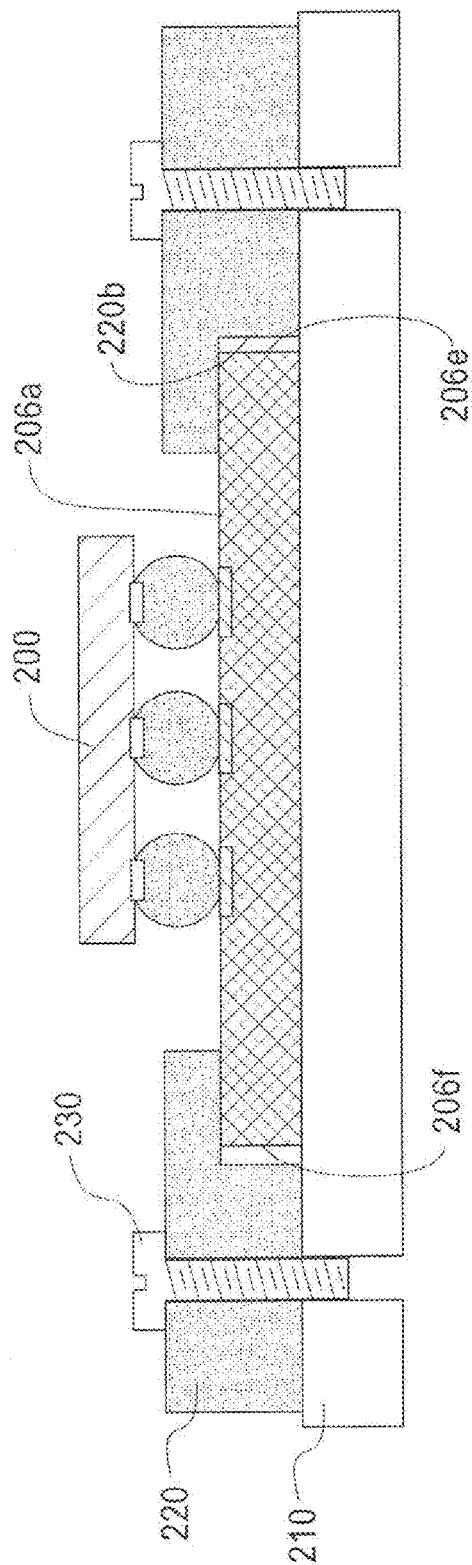
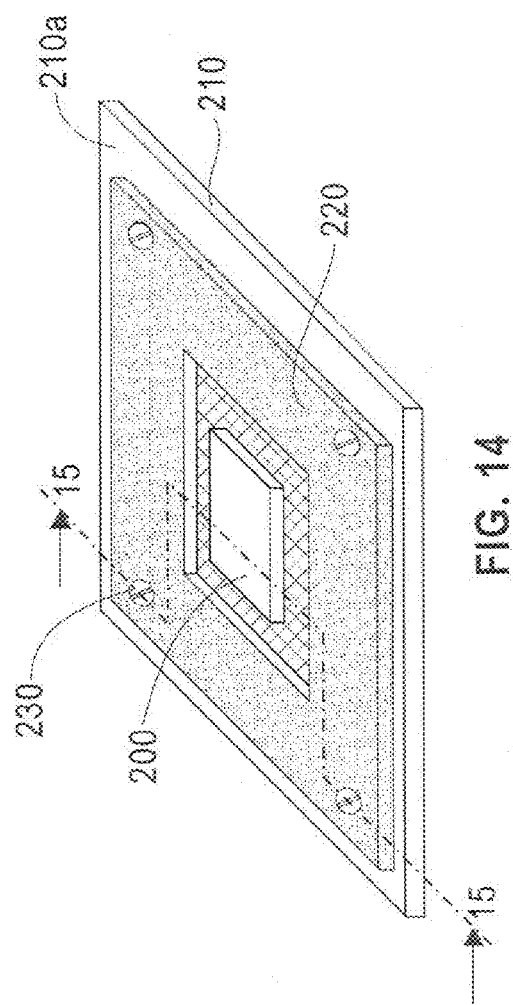
FIG. 15
FIG. 14

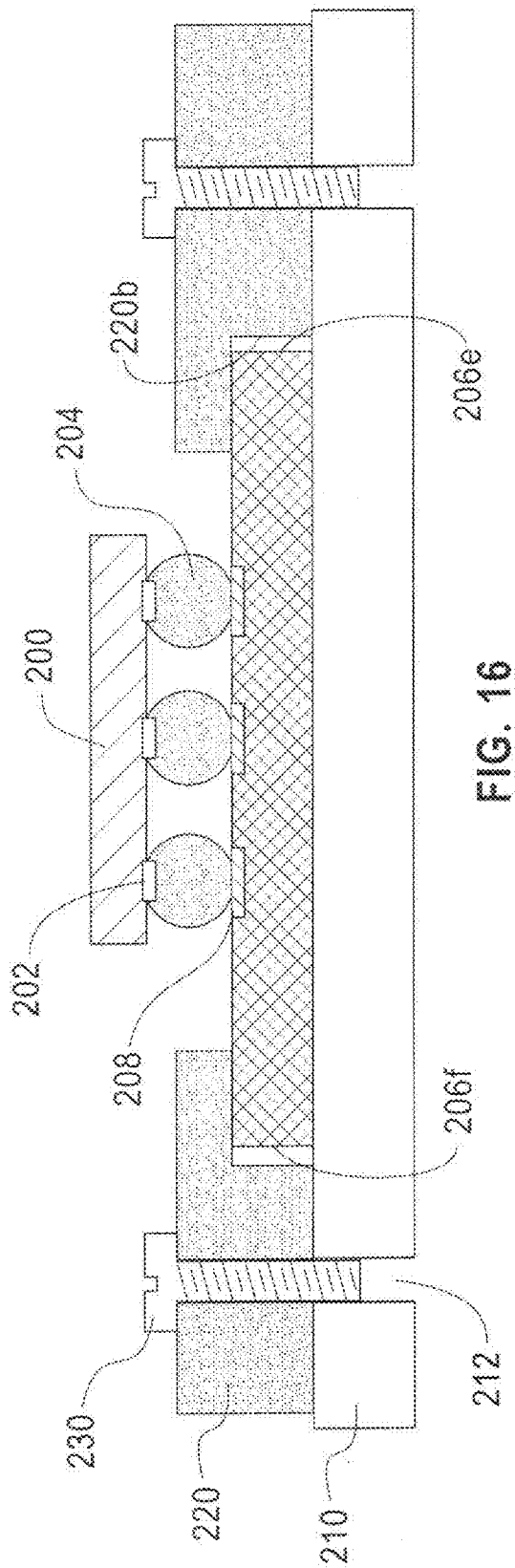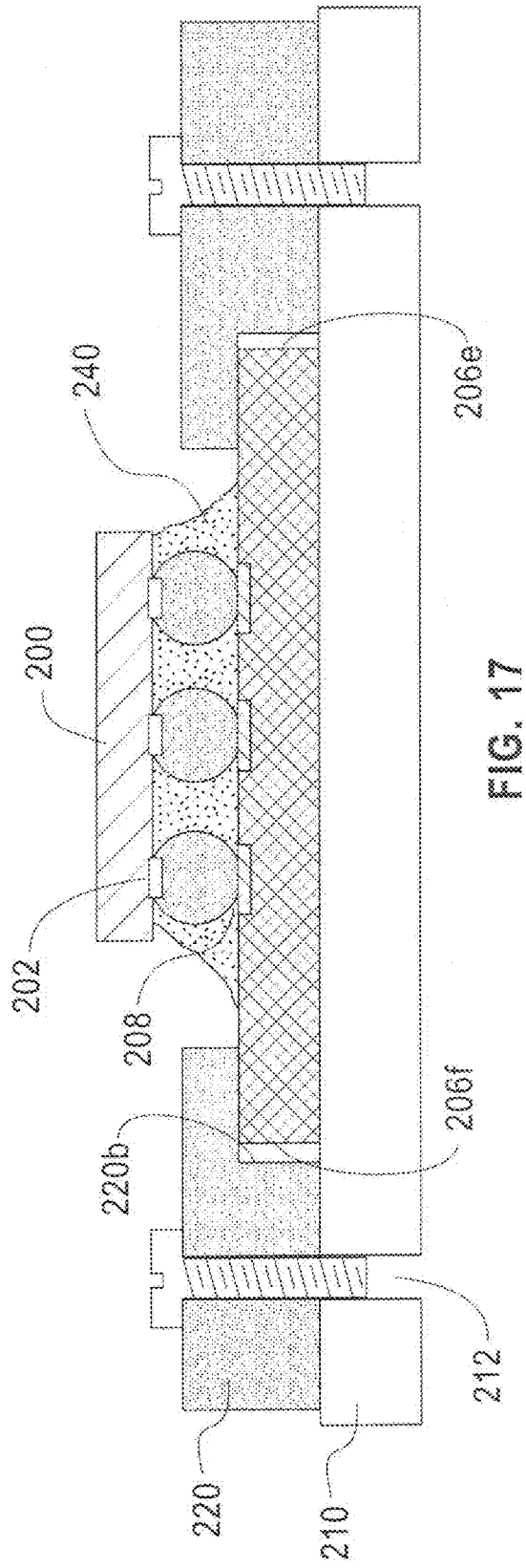

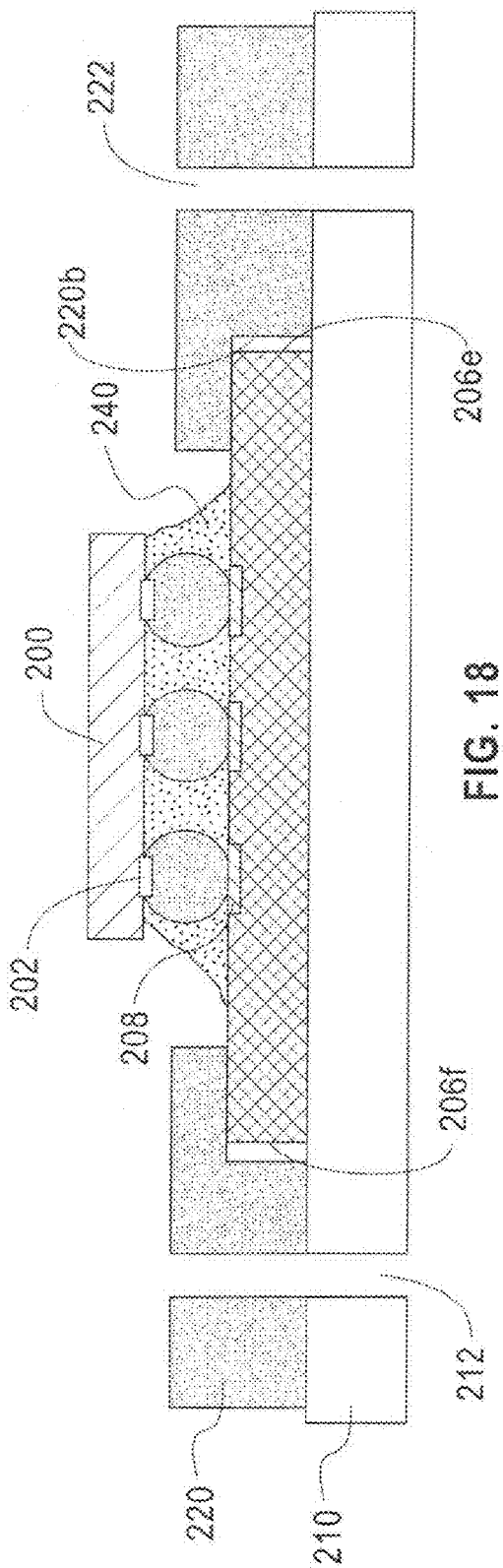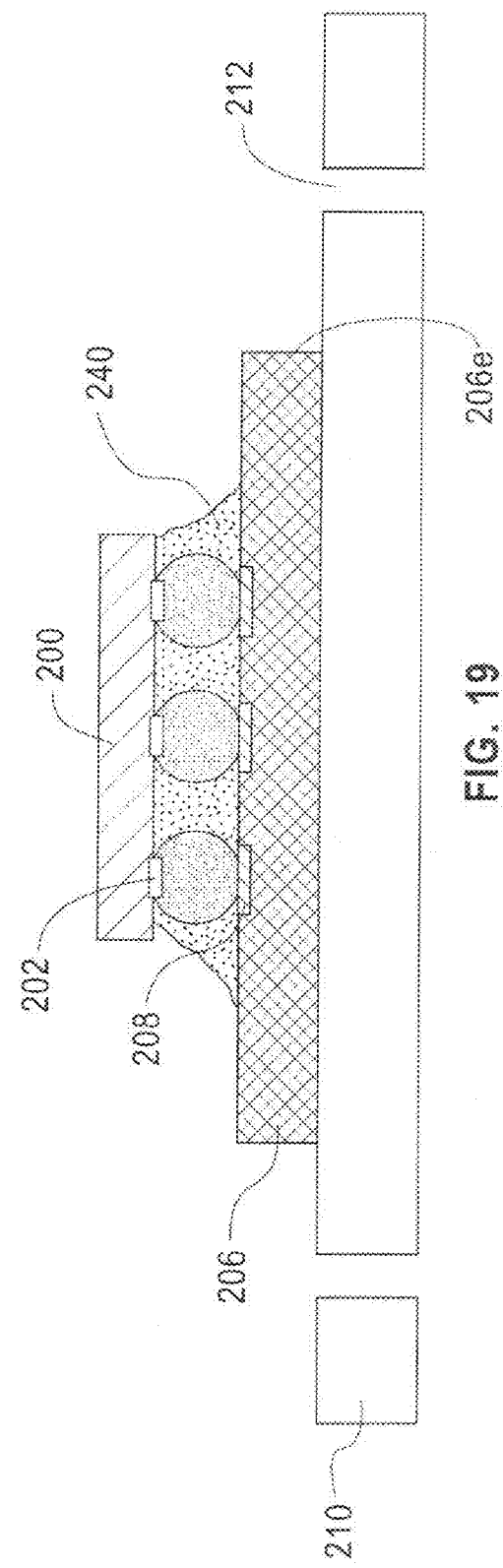

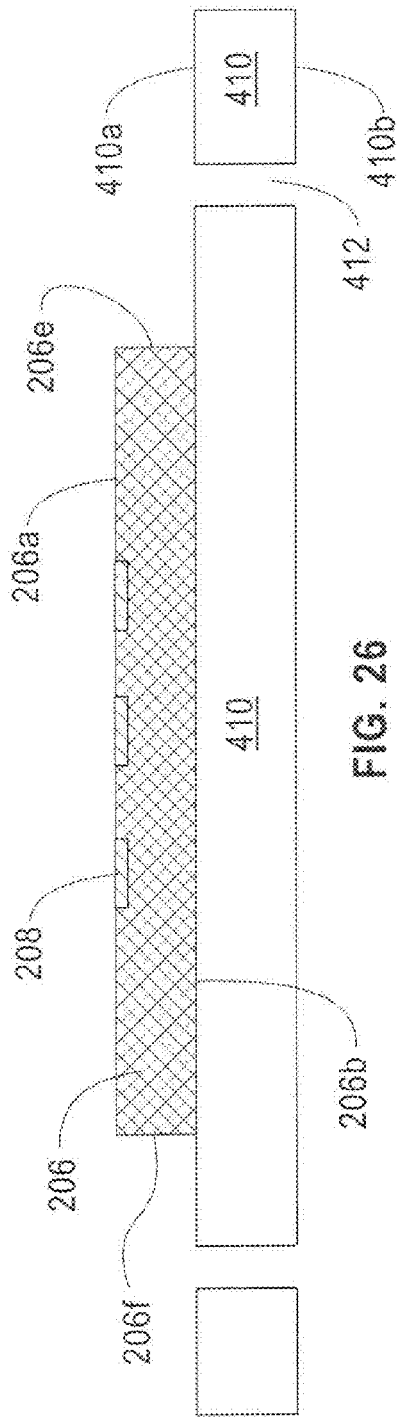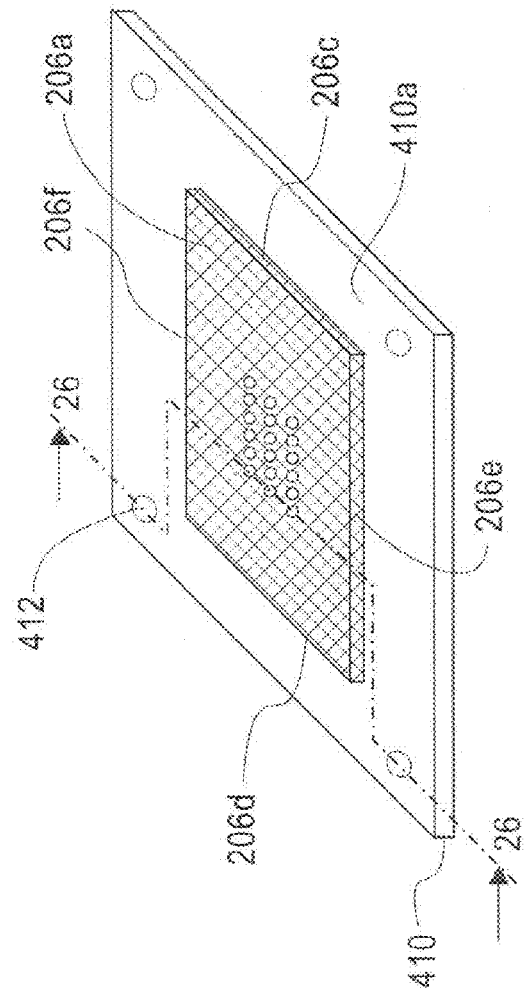

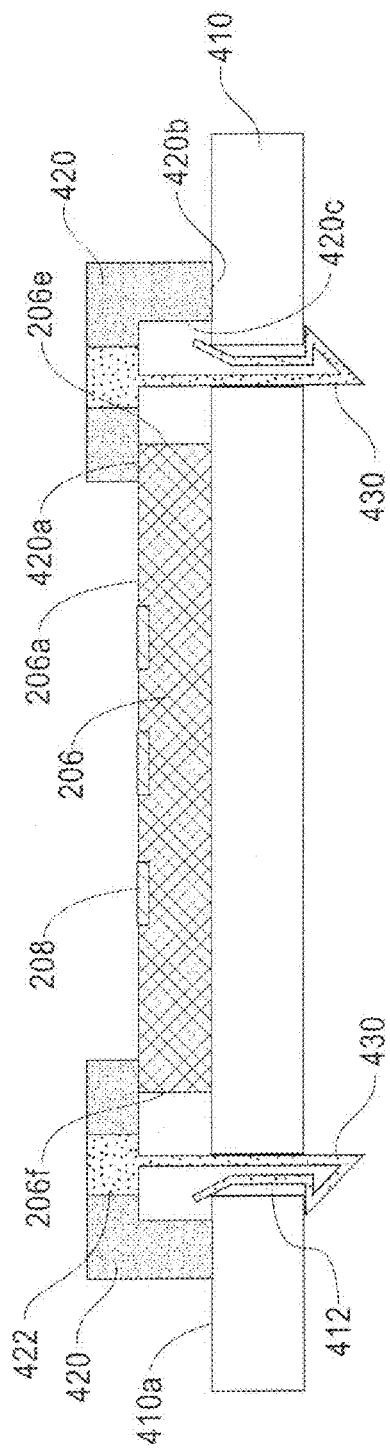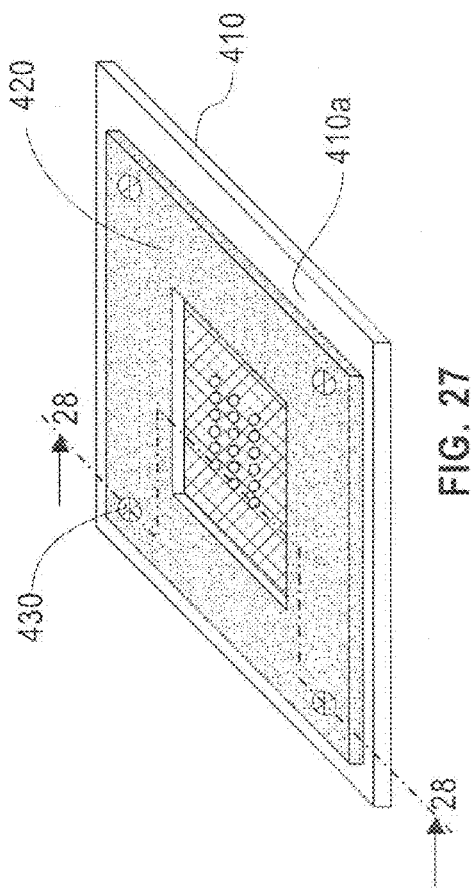

METHOD OF JOINING A CHIP ON A SUBSTRATE

The present invention relates to a method and apparatus of making a chip assembly by bonding a chip or other electronic component to a substrate. In particular, the present invention discloses a method and apparatus for assembling a silicon (Si) chip onto an organic substrate while applying mechanical force to the organic substrate to eliminate cracking or delamination in back end of line (BEOL) structure of the Si chip by reducing or preventing warping or bending of the organic substrate.

BACKGROUND

Flip chip is the name of a process in which a semiconductor Si chip is flipped over so that the connection pads face towards the substrate. Flip chip technology was first introduced by IBM in the solid logic technology hybrid modules. In the conventional flip chip bonding, ceramic carriers, typically alumina, have been used in combination with solder that has a melting temperature.

The need for high-density interconnects in cost-effective flip chip packaging is a motivation for using organic substrates. The core materials of organic substrates include glass fibers in an epoxy, a dielectric material, and a conductor material in the build-up layers of epoxy and copper. In contrast to ceramic substrates, organic substrates have lower capacitance and more resistive structures, which are conducive to high performance. Also, recently developed coreless organic substrates offer a reduction in both weight and height profile.

However, when organic substrates are used for the flip chip assembly, substrate bending and warpage can occur. This bending and warping must be addressed to guarantee high assembly yield. The bending and warpage can increase as the size of the organic substrate increases for high performance chips and components, and as the thickness of the organic substrate decreases, for example in coreless substrates.

For high performance flip chip applications, Cu-low k dielectric layers are widely used in the Back-end-of-line (BEOL) structure of Si chips to reduce capacitance in the interconnect layers, which now account for a majority of the capacitance. In recent applications of flip chips, ultra low k dielectric materials are used for lower capacitance. As the dielectric layers in the BEOL structure decrease from low k to ultra low k, the dielectric layers become more brittle because the porosity should be increased to reduce the capacitance. The ultimate goal of the dielectric layers is to provide an air gap because air has the lowest capacitance, but the stability of BEOL will decrease.

During the flip chip assembly process, the Si chip and the organic substrates experience a temperature cycle from room temperature to the melting temperature of solder materials, which make the interconnects between the Si chip and the organic substrate by melting and solidification of solder materials. The CTE mismatch between a Si chip (~2.6 ppm/° C.) and an organic substrate (~17 ppm/° C.) creates thermally-induced stress/strain in the flip-chip structure during the flip chip assembly process. The organic substrate expands and contracts more than the Si chip. This causes the organic substrate to bend after flip chip assembly because the Si chip and the substrate are connected by solder bumps and the Si chip is more rigid than the organic substrate.

The thermally-induced stress/strain in the flip-chip structure often results in a failure of the BEOL structure. This failure is becoming more common because low k dielectric layers are more fragile than solder joints. In addition, the increase in chip/substrate size and the use of coreless substrates apply greater stress on low k dielectrics.

Due to environmental concern with the use of lead-based (Pb-based) solders, the electronic manufacturing industry has hurried to replace Pb-based solders with Pb-free solders. The common Pb-free solders, such as Sn-0.7 wt % Cu, Sn-3.5 wt % Ag, and Sn—Ag—Cu, have higher melting points (about 217° C. to about 221° C.) than the melting point of eutectic SnPb solder (about 183° C.). Therefore, higher stress/strain develops in the BEOL structure of Si chips when a Pb-free solder is used in the flip chip assembly process.

By way of example, such thermally-induced stress can occur during a flip chip assembly process that uses a solder reflow process to connect the chip to a substrate. As shown in FIG. 1, a chip 100, such as a silicon (Si) chip, has a plurality of ball or bump limiting metallurgy contacts (BLM) 102 formed along a surface of the chip 100. The BLM 102 correspond to inputs/outputs (I/Os) of the chip 100. A solder bump 104 is placed on each BLM. The chip 100 is to be connected to a substrate 106, such as an organic substrate. The substrate 106 includes a plurality of pads 108. During a flip chip assembly process, chip 100 is placed onto the substrate 106 so that the bumps 104 align with the respective pads 108 of the substrate 106, as shown in FIG. 2. This portion of the assembly process is normally conducted at ambient room temperature.

The chip 100 is bonded to the substrate 106 by heating the flip chip assembly to a temperature that exceeds the melting temperature of the solder. During heating, the chip 100 and substrate 106 expand laterally, as shown in FIG. 3. The chip 100 and substrate 106 expand at different rates due to their different CTEs. Because a substrate 106 such as an organic substrate has a higher CTE than a silicon chip 100, the substrate 106 expands more than the chip 100 during heating.

After heating the flip chip assembly to a temperature that exceeds the melting temperature of the solder, the flip chip assembly is cooled. As the flip chip assembly cools, the chip 100 and substrate 106 contract, as shown in FIG. 4. Because the substrate 106 has a higher CTE than the silicon chip 100, the substrate 106 contracts more than the chip 100 during cooling of the flip chip assembly. As the temperature of the flip chip assembly drops below the melting point of the solder, the solder bumps 104 harden and secure the chip 100 to the substrate 106. During further cooling of the flip chip assembly, the substrate 106 continues to contract at a greater rate than the chip 100. The greater contraction of the substrate 106 relative to the chip 100 can produce shear, tensile, and compressive forces in the flip chip assembly that can produce stress and strain in the flip chip assembly. The stresses and strains can distort the assembly (also referred to as a flip chip package), for example by bending and/or warping the chip 100 and substrate 106, as shown in FIG. 4. Shearing forces can result at the junction of the bump 100 and BLM 102, as shown in FIG. 5, due to the greater shrinkage of the substrate 106 relative to the chip 100 during cooling. The stresses and strain can crack or delaminate the BEOL structure of the chip 100, or even cause cohesive failure between the layers of the chip 100. They can impair the electrical and mechanical connections between the flip chip 100 and the substrate 106, and degrade the performance of the flip chip assembly.

After the heating and cooling of the flip chip assembly is completed, the flip chip assembly may be cleansed of any flux that may be present and underfilled with an underfill material 110. The warping and bending that occur during the solder reflow process can permanently distort and deform the flip chip assembly, as shown in FIG. 6.

U.S. Pat. No. 7,015,066 B2 discloses a method for reducing thermal-mechanical stresses that occur in flip-chips during assembly by restraining the substrate in a fixture that engages the sides of the substrate. This arrangement does not effectively control the thermal-mechanical stresses that occur during chip assembly, particularly during a solder reflow process, and can increase the stress or strain that develops in the chip.

Accordingly, a method and apparatus are needed to manage the stresses and strain that occur during chip assembly and thereby reduce or prevent the bending or warping that can occurs during a chip assembly process, particularly one that includes a solder reflow or similar process.

BRIEF SUMMARY

The present disclosure provides a method and apparatus for assembling chips and substrates that reduces or prevents distortion such as bending and warping of the chip assembly. The present disclosure is useful in reducing or preventing bending and warping that can occur during the assembly of a chip or other electronic component onto a substrate, especially a flip chip assembly with organic substrates and chips that include low-k or ultralow-k materials. The present disclosure is especially useful in reducing or preventing bending and warping that can occur during a flip chip assembly process that heats and cools a chip assembly to bond a chip to a substrate. This is particularly useful in reducing or preventing distortion such as bending and warping that occur during a solder reflow process.

The disclosed methods and apparatuses reduce or eliminate distortions such as bending and warping that occur during chip assembly by providing a method and apparatus for restraining a substrate against the bending and warping stresses and strains that occur during chip assembly. In particular, the present disclosure provides a method and apparatus for applying a variable mechanical force and pressure to a substrate during the chip assembly process. This pressure is applied to at least a portion of the top surface and at least a portion of the bottom surface of the substrate to prevent or reducing bending and warping.

A method of joining a chip on a substrate according to the present disclosure comprises: positioning a substrate having a top surface and a bottom surface on a carrier; positioning a cover on the substrate and the carrier so that the cover contacts at least a portion of the top surface of the substrate and a portion of the top surface of the carrier; securing the cover to the carrier, wherein the carrier and the cover cooperate to apply pressure to the top surface and the bottom surface of the substrate; placing a chip onto the substrate; and bonding the chip to the substrate. The chip may be bonded to the substrate by a solder reflow process or other process that involves heating and cooling of the chip and substrate. The force with which the cover is secured to the carrier may be varied to adjust the mechanical force and pressure that the carrier and the cover apply to the substrate.

A chip assembly apparatus according to the present disclosure comprises: a carrier, said carrier including a top surface that is generally planar for supporting at least a portion of the bottom surface of a substrate and at least one aperture for receiving a fastener therein; a cover having a first surface for contacting the top surface of the carrier, a second surface for contacting at least a portion of the top surface of the substrate, a third surface extending between the first surface and the second surface, and at least one aperture for receiving a fastener therein; and at least one fastener for securing the cover to the carrier, wherein the at least one fastener secures the cover to the carrier so that the cover and the carrier apply pressure to at least a portion of the bottom surface and at least a portion of the top surface of the substrate. The third surface provides a standoff that limits the pressure that the carrier and the cover apply to the substrate when the cover is secured to the carrier by the at least one fastener.

The at least one fastener can include a screw, a pin, a clip, or other fastener. Moreover, the force with which the at least one fastener secures the cover to the carrier can be varied to adjust the pressure that the carrier and the cover apply to the substrate.

Distortions such as bending and warping of the chip assembly, including the substrate and the chip, can be reduced or prevented by the present disclosure, particularly the bending and warping that occur during assembly of a chip onto an organic substrate by a solder reflow process. This reduces or prevents opens and shorts in the chip assembly.

In another embodiment, the carrier can be configured to support more than one substrate and the cover can be configured to secure more than one substrate to the carrier. The cover can be a single, integral element, or it can comprise multiple, separate elements that secure a plurality of substrates to a carrier during chip assembly by applying pressure to at least a portion of the top surface of each substrate.

The disclosed methods and apparatuses reduce or prevent bending and warping in substrates such as ceramic and silicon substrates. They also reduce or prevent bending and warping within the BEOL structure of a chip, and cracking or delamination of the BEOL structure of a chip, and even cohesive failure between the layers of a chip, particularly during a solder reflow process. This is very useful for larger chips and coreless substrate technologies, which can bend and warp more than thincore substrates.

Another advantage of the disclosed methods and apparatuses is that they can be used during assembly of chips and substrates of any dimensions, including multiple chips and multiple substrates, to reduce or prevent bending and warping of the substrates and chips, including internal bending and warping of the BEOL structure of the chip.

BRIEF DESCRIPTION OF THE SEVERAL VIEWS OF THE DRAWINGS

The various features and advantages of the invention will be more readily understood by consideration of the following detailed description of the invention, taken in conjunction with the accompanying drawings in which:

FIG. 1 is a side elevational view in cross-section of a chip and substrate.

FIG. 2 is a side elevational view in cross-section of a chip on a substrate.

FIG. 3 is side elevational view in cross-section of a flip chip assembly during heating.

FIG. 4 is a side elevational view in cross-section of a flip chip assembly after cooling.

FIG. 5 is an expanded view of a solder bump connection of the chip and substrate of FIG. 4 showing shear forces that can occur.

FIG. 6 is a side elevational view in cross-section of a flip chip assembly that is underfilled.

FIG. 10 is a front, top perspective view of a cover placed over a substrate and carrier.

FIG. 11 is a side cross-sectional view of the cover placed on the substrate and carrier taken along line 11-11 of FIG. 10.

FIG. 12 is a front, top perspective view of a substrate secured between a cover and carrier.

FIG. 13 is a side cross-sectional view of the substrate secured between the cover and carrier taken along line 13-13 of FIG. 12.

FIG. 14 is a front, top perspective view of a substrate secured between a cover and carrier with a chip positioned on the substrate.

FIG. 15 is a side cross-sectional view of the substrate secured between a cover and carrier with a chip positioned on the substrate taken along line 15-15 of FIG. 14.

FIG. 16 is a side elevational view in cross-section of a chip assembly after the chip has been connected to the substrate.

FIG. 17 is a side elevational view in cross-section of a chip assembly after the chip has been connected to the substrate and underfilled.

FIG. 18 is a side elevational view in cross-section of a chip assembly after the chip has been connected to the substrate and underfilled and the fasteners removed.

FIG. 19 is a side elevational view in cross-section of a chip assembly after the chip has been connected to the substrate and underfilled and the cover removed.

FIG. 25 is a front, top perspective view of another embodiment of the disclosure for making a flip-chip assembly.

FIG. 26 is a side cross-sectional view taken along line 26-26 of FIG. 25.

FIG. 27 is a front, top perspective view of a substrate secured between a cover and carrier by clip or pin fasteners.

FIG. 28 is a side cross-sectional view taken along line 28-28 of FIG. 27.

DETAILED DESCRIPTION

Figure 7:
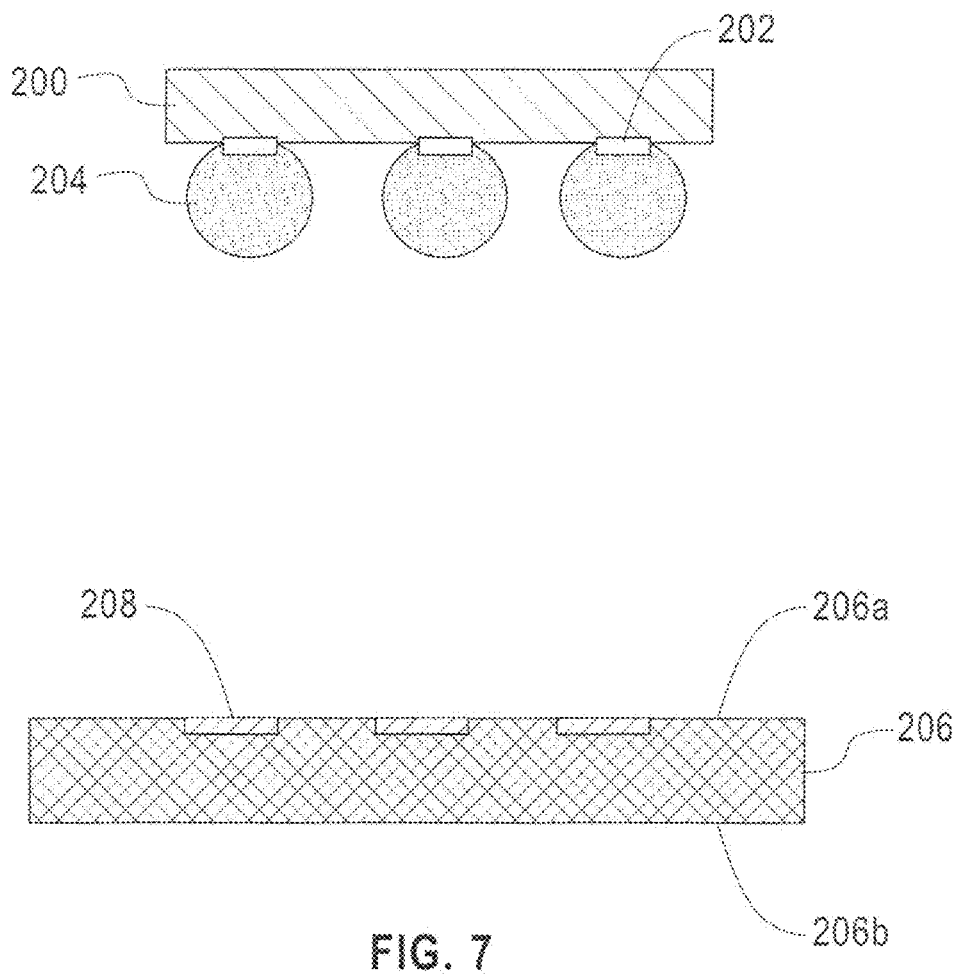
FIG. 7 is a side elevational view in cross-section of a chip and substrate to be assembled into a flip chip assembly according to an embodiment of the disclosure.
Figure 9:
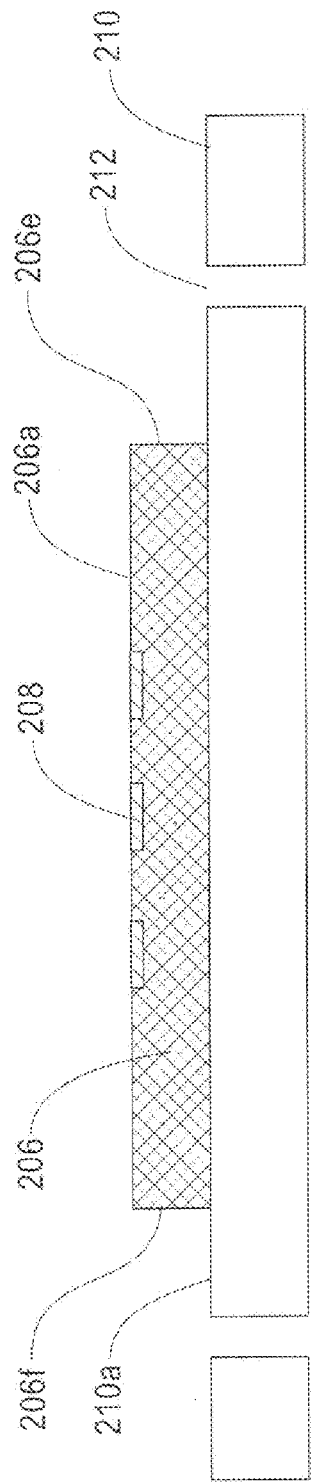
FIG. 9 is a side cross-sectional view of a substrate positioned on a carrier taken along line 9-9 of FIG. 8.
Figure 8:
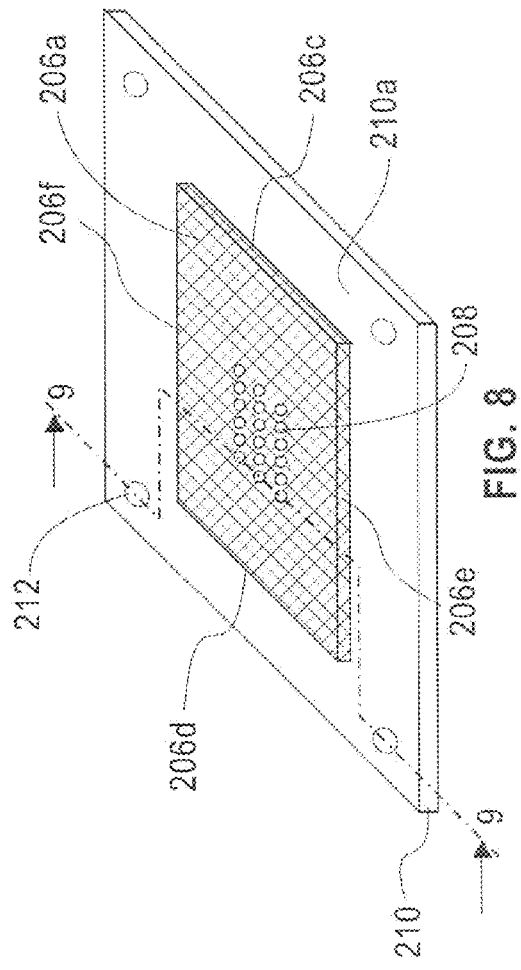
FIG. 8 is a front, top perspective view of a substrate positioned on a carrier according to an aspect of the disclosure.

According to a preferred embodiment, a chip 200 and a substrate 206 are assembled by a flip chip assembly process. As shown in FIG. 7, the chip 200, which may be a silicon chip, includes a plurality of bump limiting metallurgy contacts (BLM) 202 formed or placed on a surface of the chip 200. The BLM 202 typically correspond to I/Os of the chip 200. A bump 204, such as a solder bump, is disposed on each BLM 202. A substrate, such as an organic substrate 206, includes a top surface 206a and a bottom surface 206b. The substrate 206 includes four lateral edges 206c, 206d, 206e, 206f, as shown in FIGS. 8 and 9. The substrate 206 includes a plurality of conductive pads 208 disposed along the top surface 206a of the substrate 206. The bumps 204 can be applied by any means, for example by evaporation, electroplating, direct placement (ball drop), IMS (C4NP), and the like.

The substrate 206 is positioned on a carrier 210 so that the bottom surface 206b of the substrate 206 contacts a top surface 210a of the carrier 210, as shown in FIGS. 8 and 9. The top surface 210a of the carrier 210 is substantially flat or planar. The carrier 210 includes a plurality of apertures 212 that extend through the carrier 210. Each aperture 212 is dimensioned and configured to receive a fastener such as a screw, clip, pin, or other fastener. The cross-section of each aperture 212 may be circular, oval, rectangular, square, irregular-shaped, or any other configuration that secures a fastener such as a screw, clip, pin therein. Although each aperture 212 is shown as extending through the entire thickness or cross-section of the carrier 210 in FIG. 9, the apertures 212 do not have to extend completely through the carrier 210 as long as they provide a means for receiving and securing a fastener such as a screw, clip, or pin therein. The carrier 210 is made of a rigid material, for example stainless steel, that remains substantially flat or planar during heating and cooling of the chip 200 and substrate 206. Carrier 210 may comprise any other rigid material, including non-metallic materials.

A cover 220, for example a cover plate, is positioned on the substrate 206 and on the carrier 210, as shown in FIGS. 10 and 11. The cover 220 includes an opening 225, as shown in FIGS. 10 and 11, so that cover 220 does not obscure the conductive pads 208 of the substrate 206, when cover 220 is positioned on carrier 210 and substrate 206. Cover 220 also includes a plurality of apertures 222 for receiving a fastener such as a screw, clip, or pin.

The cover 220 includes a first surface 220a that contacts at least a portion of the top surface 206a of the substrate 206. The cover 220 includes a second surface 220c that contacts a portion of the top surface 210a of the carrier 210. The cover 220 also has a third surface 220b that extends between the first surface 220a and the second surface 220c. The third surface 220b is depicted as substantially vertical in FIGS. 10 and 11; however, it can be other orientations or configurations extending between the first surface 220a and the second surface 220c. The cover 220 is configured and dimensioned so that the third surface 220b is spaced a sufficient distance from edges 206c, 206d, 206e, 206f of the substrate 206 when the cover 220 is positioned on the substrate 206 and carrier 210 to permit lateral expansion of the substrate 206 when the chip assembly is heated. The cover 220 is a rigid material, for example stainless steel, that remains substantially flat or planar during heating and cooling of the chip 200 and substrate 206. Cover 220 may comprise any other rigid materials, including non-metallic materials.

The cover 220 is arranged on the carrier 210 so that the apertures 222 of the cover 220 align with corresponding apertures 212 of the carrier 210, as shown in Figure 11. Each aperture 222 is dimensioned and configured to receive a fastener, for example a screw. In an alternate embodiment, each aperture 222 is dimensioned and configured so that a screw or fastener does not engage the surface of the aperture 222 of the cover 220, but only engages the aperture 212 of the carrier 212. 12

After cover 220 is positioned on carrier 210 and substrate 206, a fastener such as a screw 230 is placed in each aperture 222 of cover 220 and each corresponding aperture 212 of carrier 210, as shown in FIGS. 12 and 13. The clamping force and pressure that the cover 220 and the carrier 210 apply to the substrate 206 can be adjusted by varying the force with which each screw 230 is tightened when securing the cover 220 to the carrier 210. In addition, the third surface 220b of the cover 220 can act as a mechanical standoff when the cover 220 is secured to the carrier 210. The length of the third surface 220b can be adjust to vary or limit the amount of force that the cover 220 and carrier 210 applies to the top surface 206a and bottom surface 206b of the substrate 206 when the cover 220 is secured to the carrier 210. The length of the third surface 220b is the same or substantially the same as the thickness of the substrate 206, as shown in FIG. 13. The dimensions of the cover 220, including the dimensions of the first surface 220a, the second surface 220c, and the 220b, can be varied depending upon the dimensions of the substrate 206, the chip 200, and any other top side components on the substrate 206, as well as the extent and location of the contact area that is desired to be maintained between the cover 220 and substrate 206.

After the substrate 206 is clamped between the carrier 210 and the cover 220, a chip 200 is disposed on the substrate, as shown in FIGS. 14 and 15. Persons skilled in the art will appreciate and understand that the chip 200 can be disposed on the substrate 206 before or after the substrate 206 is clamped between the carrier 210 and the cover 220.

The chip 200 is connected to the substrate 206, for example by bonding with a solder reflow process. During the solder reflow process, the chip assembly is heated to a temperature that exceeds the melting point of the solder bumps 204. The maximum temperature needed to melt lead-free solder bumps is higher than the temperature required to melt eutectic lead solder. During heating of the flip chip assembly, the chip 200 and substrate 206 expand. Because the CTE of the substrate 206 exceeds the CTE of the chip 200, the substrate 206 expands more than the chip 200. During heating of the flip chip assembly, the force and pressure applied to the substrate 206 by the cover 220 and the carrier 210 permit the substrate 206 to expand laterally.

After heating the flip chip assembly to melt the solder, the flip chip assembly is permitted to cool. As the flip chip assembly cools, the chip 200 and the substrate 206 contract. Because the CTE of the substrate 206 exceeds the CTE of the chip 200, the substrate 206 contracts more than the chip 200. As the temperature of the flip chip assembly falls below the melting point of the solder, the solder hardens and the bumps 204 connect the chip 200 to the substrate 206. As the temperature continues to fall below the melting point of the solder, the chip 200 and substrate 206 continue to contract. Because the substrate 206 contracts at a greater rate than the chip 200, the greater contraction of the substrate 206 creates internal stresses in the flip chip assembly. The pressure applied to the top surface 206a and the bottom surface 206b of the substrate 206 by the carrier 210 and the cover 220 reduce or prevent distortion such as bending and warping of the substrate 206 and the chip 200, as shown in FIG. 16.

After the flip chip assembly cools sufficiently, for example to ambient or room temperature, the flip chip assembly may be cleansed, if necessary, of any flux. If a no clean flux is used, a cleaning operation may be optional. The flip chip assembly can be underfilled with an underfill adhesive material 240, as shown in FIG. 17. Underfill adhesive materials can include resins such as epoxies, cyanate esters, and phenolic, and may include fillers, catalysts, coupling agents, stress absorbers, and the like. The underfill can be cured by application of heat in which case the cover 220 and carrier 210 also act to reduce or prevent any potential warping or bending of the substrate 206 and chip 200 that may occur during this process. Alternatively, the cover 220 and carrier 210 may be removed prior to underfilling, and an underfilling process may be optional.

Figure 20:
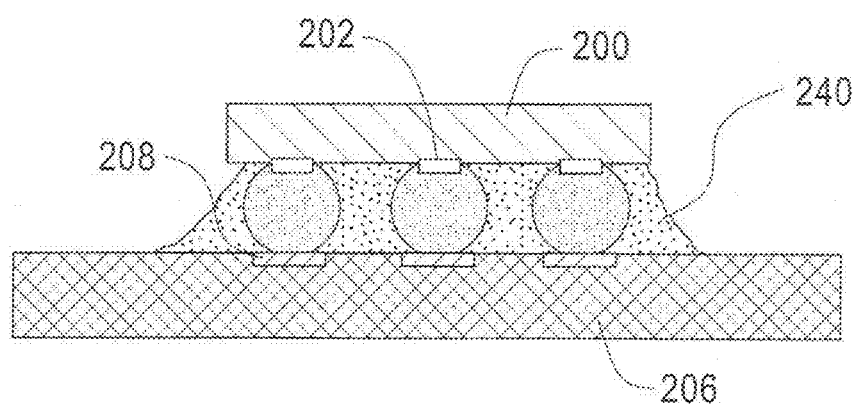
FIG. 20 is a side elevational view in cross-section of a chip assembly made according to an embodiment of the disclosure.

Once the packaging of the flip chip assembly has been completed, the screws 230 are removed from the cover 220 and carrier 210, as shown in FIG. 18. The cover 220 and carrier 210 can be removed, as shown in FIGS. 19 and the completed chip assembly can be removed from the carrier 210, as shown in FIG. 20. The flip chip assembly is ready for further processing or use.

The dimensions and configuration of the cover 220 and the carrier 210 can be varied to adjust the extent and location of the mechanical force and pressure that the cover 220 and the carrier 210 apply to the top surface 206a and the bottom surface 206b of the substrate 206. The cover 220 and carrier 210 should be secured to one another with enough force to provide sufficient pressure on the top surface 206a and the bottom surface 206b of the substrate 206 to prevent or reduce distortion such as bending and warping but without restricting lateral extension of the substrate 206. For larger sized chips, the cover 220 and carrier 210 may be configured to clamp the substrate 206 further from the center of the chip 200 to reduce or prevent bending and warping. Although this embodiment is illustrated with a solder reflow process, the disclosed method and apparatus can be used to prevent or reduce distortions such as bending and warping for other chip assembly processes that involve heating and cooling of the chip assembly, for example, thermo-compression, ultrasonic bonding, and the like.

Figures 21, 22:
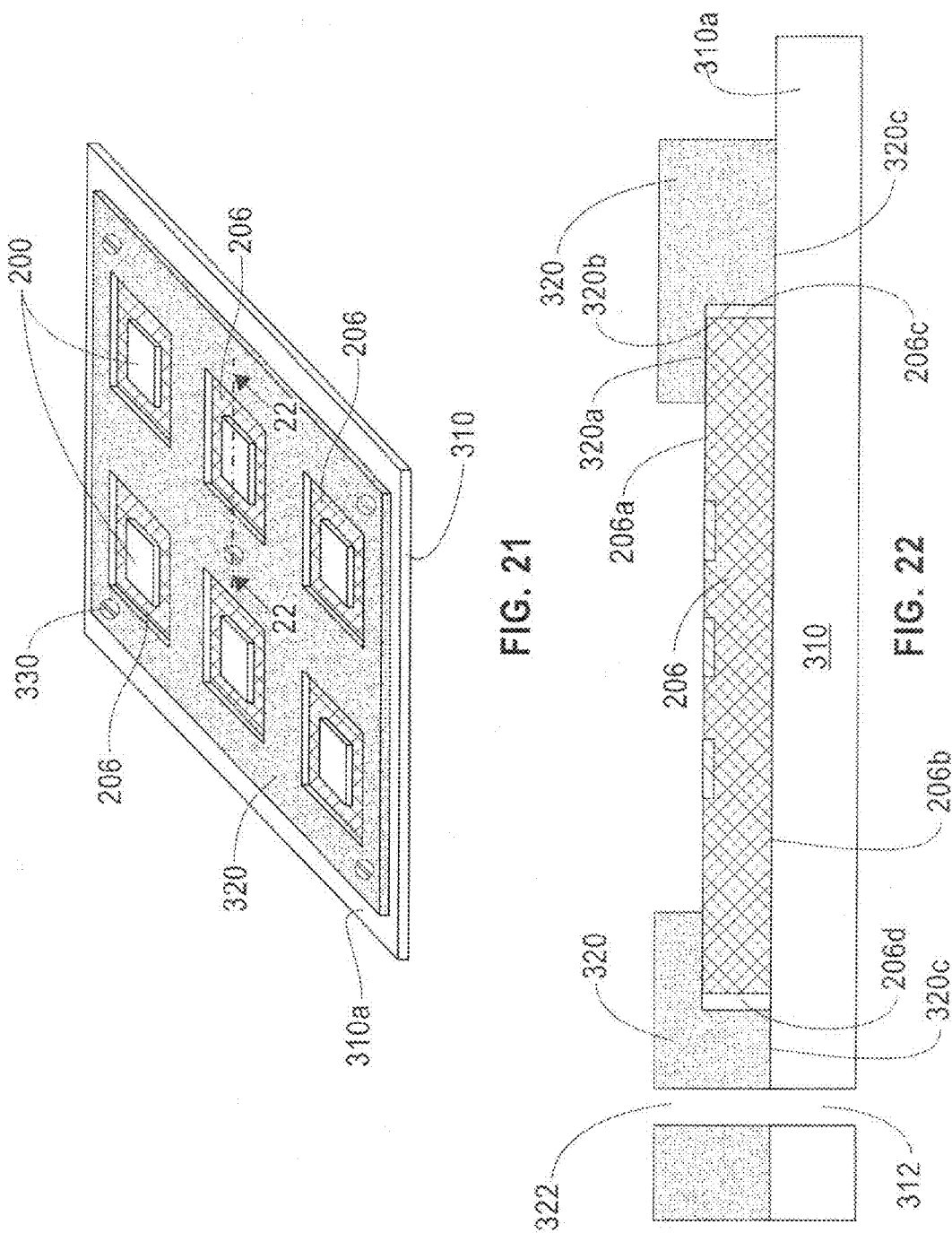
FIG. 21 is a front, top perspective view of another embodiment for assembling multiple chip assemblies.
FIG. 22 is a side cross-sectional view of an embodiment for assembling multiple chip assemblies of FIG. 21 taken along line 22-22 of FIG. 21.

According to another aspect of the disclosure, a high volume manufacturing method and apparatus are possible. As shown in FIG. 21, a plurality of chip assemblies comprising a chip 200 and a substrate 206 are disposed on a carrier 310. The carrier 310 has a substantially flat or planar top surface 310a. A cover 320 with a plurality of openings to accommodate multiple chip assemblies is positioned on the carrier 310 and in contact with a portion of the top surface 206a of each substrate 206. The openings in cover 320 permit a chip 200 to be positioned on each substrate 206. As shown in a cross-sectional view of FIG. 22, the cover 320 includes a first surface 320a that engages a top surface 206a of each substrate 206, a second surface 320c that engages a portion of the top surface 310a of the carrier 310, and a third surface 320b that extends between the first surface 320a and the second surface 320c. The cover 320 is configured and dimensioned so that the third surface 320b is spaced from the lateral edges 206c, 206d, 206e, 206f of each substrate 206 to permit lateral expansion. The cover 320 is positioned on the carrier 310 so that fastener apertures 322 in the cover 320 align with fastener apertures 312 in the carrier 310, as in the previous embodiment. The cover 320 engages a portion of the top surface of each substrate 206, preferably along an entire periphery of each substrate 206, to secure each substrate 206 to the carrier 310, as shown in FIGS. 21 and 22. However, cover 320 may be configured and dimensioned to engage less than the entire periphery of each substrate 206.

The cover 320 is secured to the carrier 310 by a plurality of fasteners 330, for example screws. Each substrate 206 is secured or clamped between the carrier 310 and the cover 320. The pressure applied to each substrate 206 can be varied by adjusting the force with which each fastener 330 secures the cover 320 to the carrier 310. A variety of configurations of the carrier 310 and cover 320 are possible and within the scope of this invention as long as the carrier 310 and cover 320 are secured to one another to clamp the substrate 206 between them and to apply pressure to a top surface 206a and a bottom surface 206b of the substrate 206 to prevent or reduce the bending and warping that can occur during the heating and cooling of a reflow or similar chip assembly process. The placement and number of fasteners 330 can vary depending on the mechanical force and pressure to be applied to the substrate 206, the materials used for the carrier 310, cover 320, chip 200 and substrate 206, and manufacturing parameters. The portion of the top surface 206a and bottom surface 206b of each substrate 206 to which the cover 320 and carrier 310 apply pressure can vary depending upon the size and composition of each substrate 206 and chip 200, and parameters of the bonding process. As in the previous embodiment, the cover 320 and carrier 310 may be any rigid material, for example stainless steel, but other rigid, non-metallic material may be used.

Figure 23:
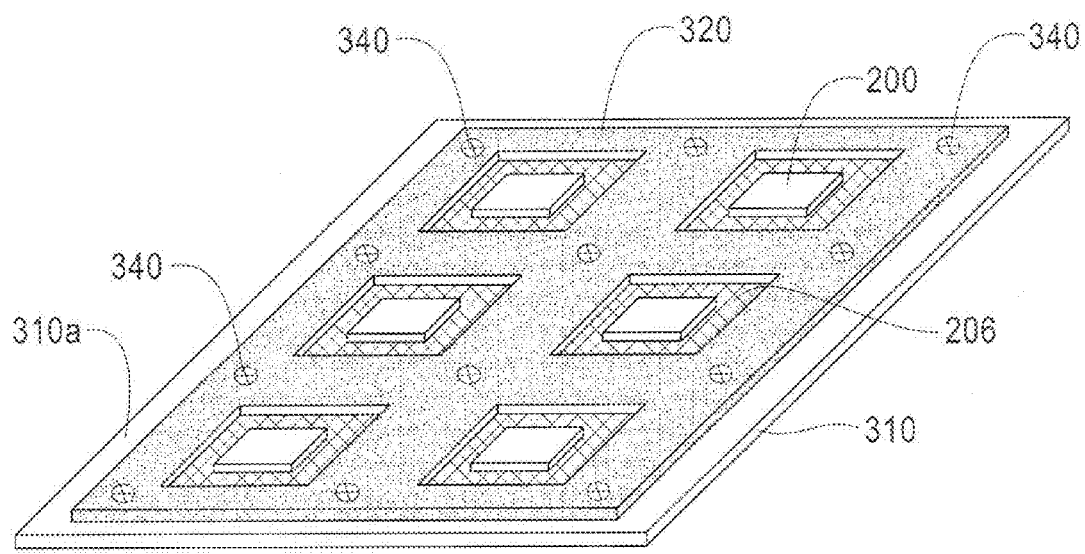
FIG. 23 is a front, top perspective view of a further embodiment for assembling multiple chip assemblies.

In another embodiment shown in FIG. 23, the cover 320 may be secured to the carrier 310 by fasteners such as clips or pins 340, particularly quick-connect type clips or pins that can be secured and removed more rapidly than fasteners such as screws. The placement and number of the clips or pins 340 can vary depending on the materials used for the carrier 310, cover 320, chip 200, and substrate 206, and other manufacturing parameters. The dimensions and configuration of each clip or pin 340 can be varied to adjust the force with which each clip or pin 340 secures the cover 320 to the carrier 310, and the pressure that the cover 320 and the carrier 310 apply to the substrate 206. Other details of the apparatus and method of securing the cover 320 to the carrier 310 using fasteners such as clips or pins 340 is disclosed in the following embodiment.

Figure 24:
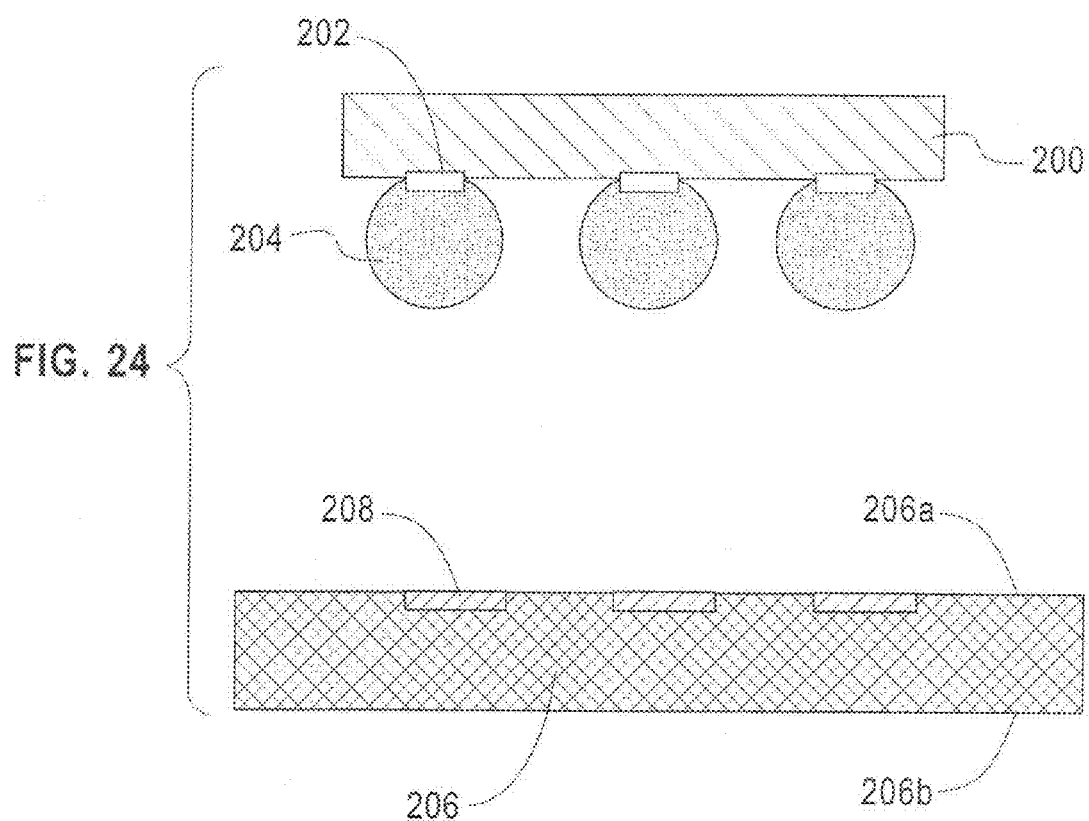
FIG. 24 is a side elevational view in cross-section of a chip and substrate to be assembled into a chip assembly according to another embodiment of the disclosure.

In another embodiment of the disclosure, a chip 200, such as a silicon chip, is to be bonded to a substrate 206 to form a chip assembly using a carrier 410 and a cover 420 that are secured to one another by fasteners such as clips or pins 340, particularly quick-connect type clips or pins that can be secured and removed more rapidly than fasteners such as screws. As shown in FIG. 24, the chip 200 includes a plurality of BLM 202 formed or placed on a surface of the chip 200. A bump 204, such as a solder bump, is disposed on each BLM 200. A substrate, such as an organic substrate 206, includes a plurality of conductive pads 208 disposed along a top surface 206a of the substrate 206.

The substrate 206 is positioned on a carrier 410 so that a portion of a bottom surface 206b of the substrate 206 is in contact with the top surface 410a of carrier 410, as shown in FIGS. 25 and 26. The top surface 410a of the carrier 410 is substantially flat or planar. The carrier 410 includes a plurality of apertures 412 that extend through the carrier 410. Each aperture 412 is dimensioned and configured to receive a fastener, for example a clip, pin, or the like. Although each aperture 412 is shown extending through the entire cross-section of the carrier 410 in FIG. 26, the apertures 412 do not have to extend completely through the carrier 410 as long as they provide a means for a fastener to be received and secured therein.

A cover 420 with a plurality of apertures 422 is positioned on the substrate 206 and on the carrier 410, as shown in FIGS. 27 and 28. The cover 420 includes a first surface 420a that contacts a portion of the top surface 206a of the substrate 206. The cover 420 includes a second surface 420b that contacts the top surface 410a of carrier 410. The cover includes a third surface 420c that extends between the first surface 420a and the second surface 420b. The cover 420 is dimensioned so that the third surface 420c does not contact the lateral edges 206c, 206d, 206e, 206f of the substrate 206, as partially shown in FIG. 28, to permit lateral expansion of the substrate 206 when the chip assembly or chip package is heated. The length of the third surface 420c is the same or substantially the same as the thickness of the substrate 206, as shown in FIG. 28.

The cover 420 is positioned on the carrier 410 so that the apertures 422 of the cover 420 align with the apertures 412 of the carrier 410. Each aperture 422 of the cover 420 is dimensioned and configured to receive a fastener 430, for example, a clip, pin, or the like that provides a quicker connect-disconnect capability than a fastener such as a screw. The carrier 410 and the cover 420 can be made of any rigid material, for example stainless steel, and rigid, non-metallic materials may be used.

After the cover 420 is positioned on the carrier 410 and substrate 206, a fastener 430 such as a clip or pin is placed in each aperture 422 of the cover 420 and corresponding aperture 412 of the carrier 410. The clip or pin fastener 430 is configured to be inserted into the apertures 422, 412 of the cover 420 and the carrier 410 to secure the cover 420 to the carrier 420 more quickly than fasteners such as screws. The configuration of each clip or pin fastener 430 can be a quick-connect or snap-fastening configuration that facilitates rapid insertion and quick securing of the cover 420 to the carrier 410. This permits the substrate 206 to be clamped between the carrier 410 and the cover 420 in less time than with fasteners such as screws, while still securing the cover 420 to the carrier 410 with sufficient force to apply the necessary pressure to the substrate 206 during chip assembly. The clip or pin fastener 430 can be a spring clip, as shown in FIG. 28. Persons skilled in the art will appreciate that many other types of quick-connect or snap-fastening clip and pin fasteners 430 may be used to secure the cover 420 to the carrier 410. The pressure applied to the substrate 206 by the cover 420 and carrier 410 can be varied by using clip or pin fasteners 430 of different configurations and dimensions, or varying the force applied by each clip or pin fastener 430 when the cover 420 is secured to the carrier 410. The number and position of the clip or pin fasteners 430 can be varied based on the size and configuration of the chip assembly, the bonding process, the desired pressure to be applied to the substrate 206, and other parameters. The carrier aperture 412 and cover aperture 422 may be any configuration needed to receive and secure a clip or pin fastener 430.

Figure 30:
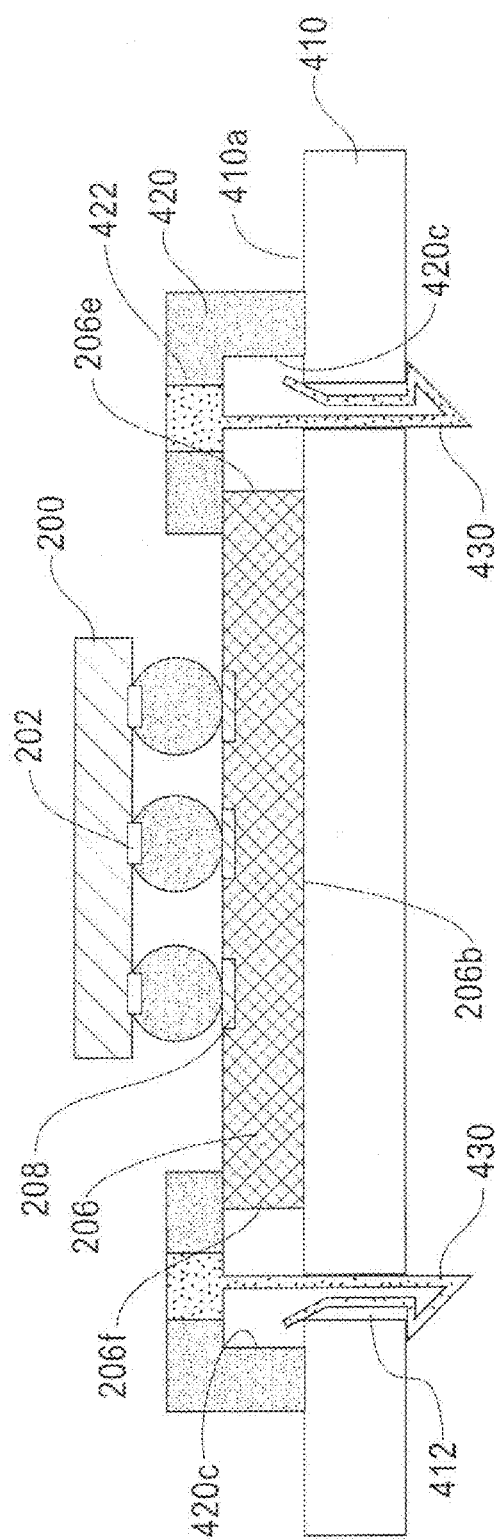
FIG. 30 is a side cross-sectional view taken along line 30-30 of FIG. 29.
Figure 29:
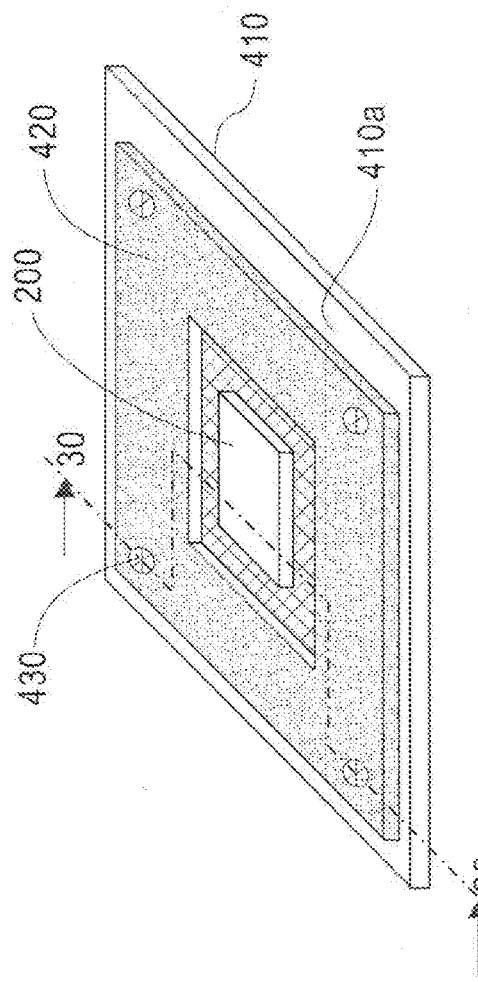
FIG. 29 is a front, perspective view of a chip assembly with the substrate secured between a cover and carrier by clip or pin fasteners.

After the substrate 206 is clamped between the cover 420 and the carrier 410, a chip 200 is disposed on the substrate 206, as shown in FIGS. 29 and 30, so that the bumps 204 of the chip 200 align with the respective pads 208 of the substrate 206. The chip 200 can be disposed on the substrate 206 before the substrate 206 is secured between the carrier 410 and the cover 420.

The chip 200 is connected to the substrate 206 for example by a solder reflow or other bonding process that involves heating and cooling of the chip assembly. The chip assembly is heated to a temperature that exceeds the melting point of the solder bumps 104. This temperature is normally higher for lead-free solders than for lead-based solders. The chip assembly can be heated by any means that causes the bumps 204 to connect and bond the chip 200 to the substrate 206 and provide electrical connections between the chip 200 and the substrate 206. As the chip assembly is heated, the chip 200 and the substrate 206 expand. Because the CTE of the substrate 206 exceeds the CTE of the chip 200, the substrate 206 expands more than the chip 200. During heating of the chip assembly, the force and pressure applied to the top surface 206a and the bottom surface 206b of the substrate 206 by the cover 420 and the carrier 410 permit the substrate 206 to expand laterally.

Figure 31:
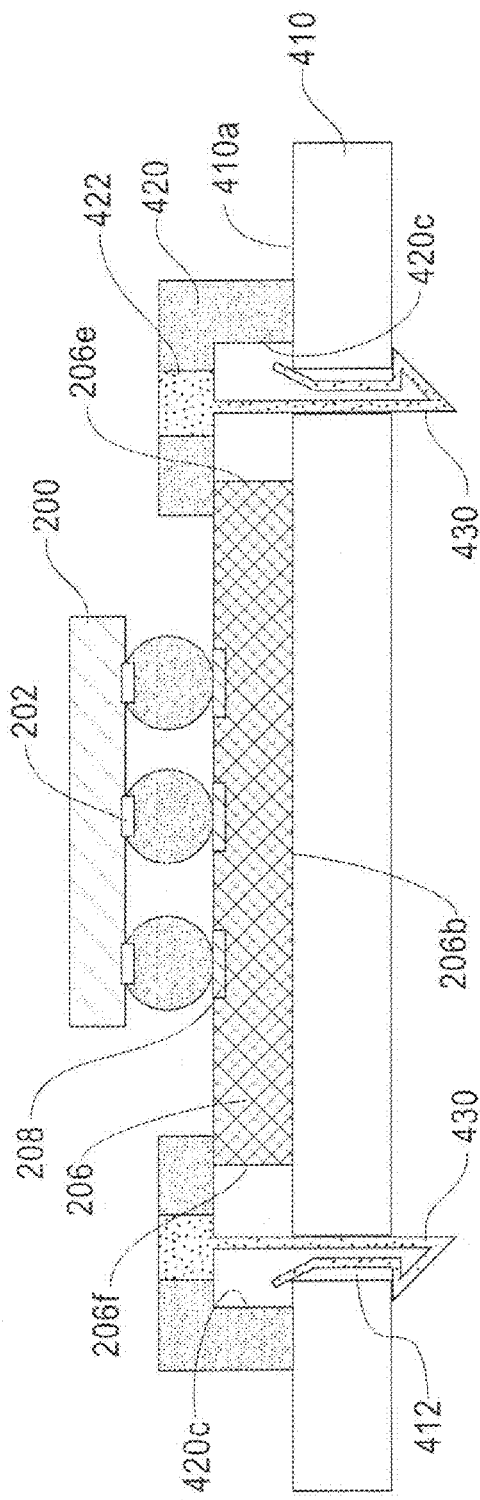
FIG. 31 is a side elevational view in cross-section of a chip assembly after the chip is bonded to the substrate.

After heating the flip chip assembly to a temperature that exceeds the melting temperature of the solder, the flip chip assembly is permitted to cool. As the flip chip assembly cools, the chip 200 and substrate 206 contract. Because the CTE of the substrate 206 exceeds the CTE of the chip 200, the substrate 206 contracts more than the chip 200. As the temperature of the flip chip assembly falls below the melting point of the solder, the bumps 204 harden and connect the chip 200 to the substrate 206. Further cooling of the chip assembly causes further contraction of the substrate 206 and the chip 200. The pressure applied to the top surface 206a and the bottom surface 206b of the substrate 206 by the carrier 410 and the cover 420 prevents or reduces distortions such as bending and warping in the chip 200 and substrate 206 during the heating and cooling process so that the integrity of the connections of the chip 200 and substrate 206 are maintained in the bonded chip assembly, as shown in FIG. 31.

Figure 32:
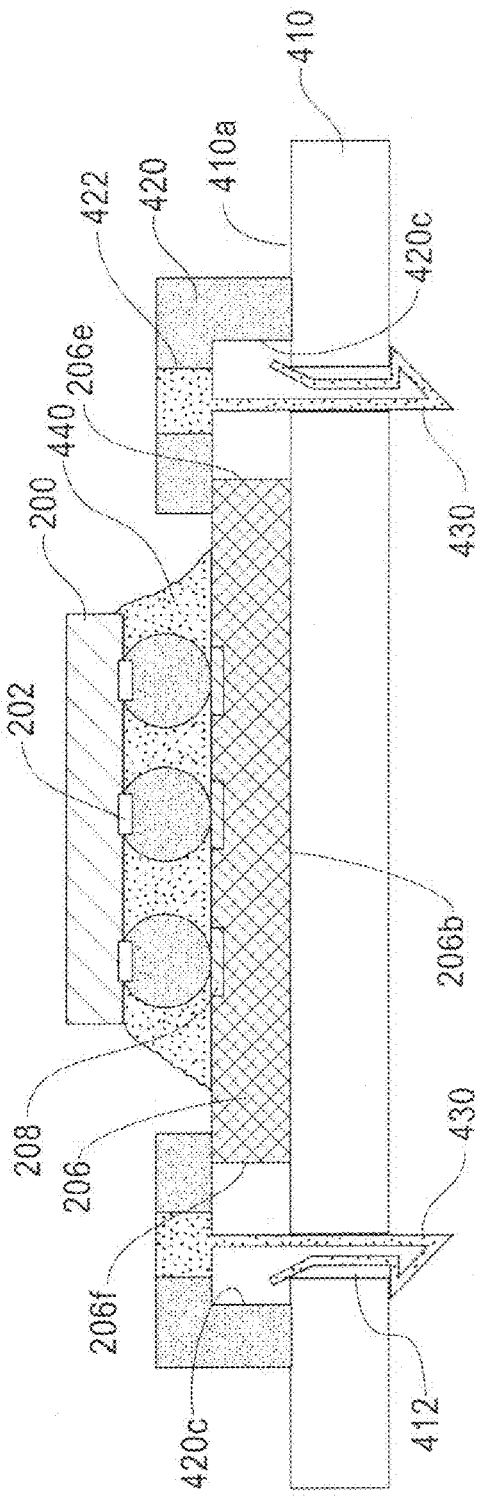
FIG. 32 is a side elevational view in cross-section of a chip assembly that has been underfilled after the chip is bonded to the substrate.

After the chip assembly cools sufficiently, for example to ambient or room temperature, it may be cleansed of any flux and other materials that may be present, as necessary. If a no clean flux is used, a cleaning operation may be optional. The chip assembly can be underfilled with an underfill adhesive material 440, as shown in FIG. 32. Suitable underfill adhesive materials can include resins such as epoxies, cyanate esters, and phenolic, and may include fillers, catalysts, coupling agents, stress absorbers, and the like. The underfill 440 can be cured by application of heat in which case the cover 420 and carrier 410 reduce or prevent any potential warping or bending of the substrate 206 and chip 200 that might occur. Alternatively, the cover 420 and carrier 410 may be removed prior to underfilling, and an underfilling process may be optional.

Figure 33:
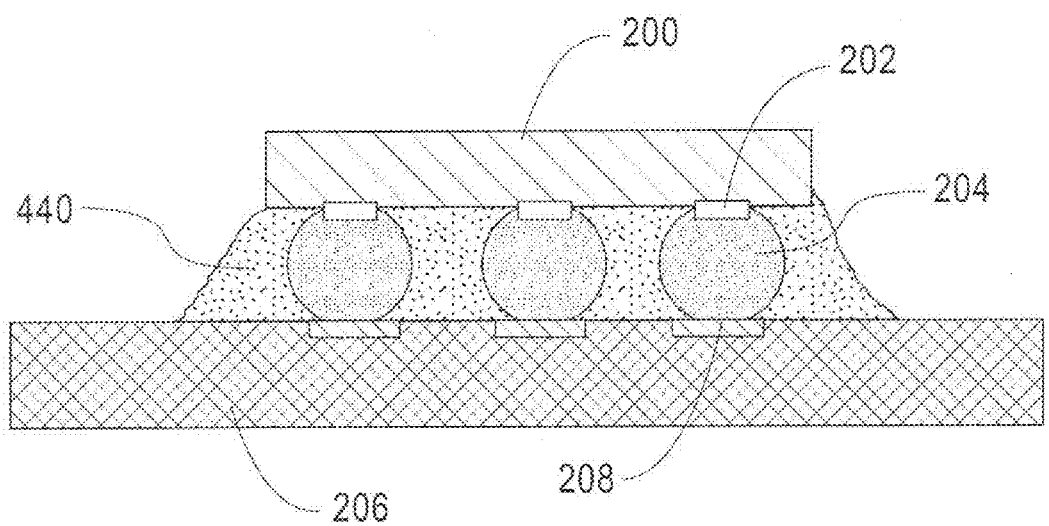
FIG. 33 is a side elevational view in cross-section of a chip assembly.

Once the packaging of the chip assembly has been completed, the pins 430 are removed from the cover 420 and the carrier 410. The cover 420 is removed from the carrier 410 and the chip assembly is ready for further processing or use, as shown in FIG. 33.

Figure 34:
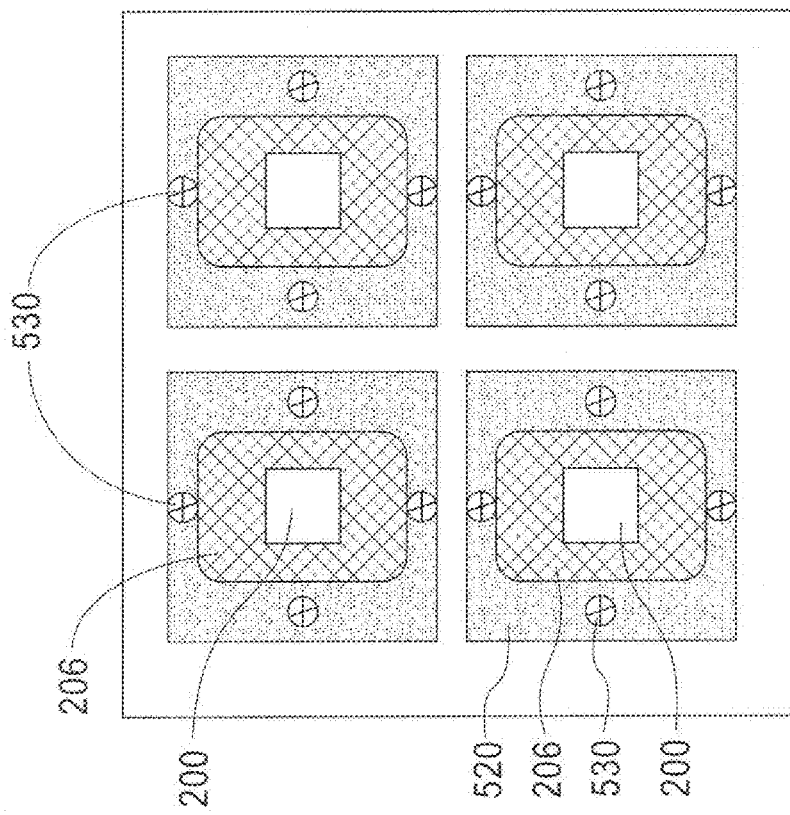
FIG. 34 is a top plan view of yet another embodiment in which chip assemblies are secured to a carrier by individual covers and clip or pin fasteners.

Another high volume method of making chip assemblies is shown in FIG. 34. In this embodiment, a plurality of chip assemblies comprising a chip 200 and a substrate 206 are secured to a carrier 510 by individual covers 520. Each cover 520 engages a portion of the top surface 206a of each substrate 206, as shown in FIG. 34. Each cover 520 is secured to the carrier 510 by a plurality of fastener clips or pins 530 that are secured in corresponding apertures of each cover 520 and carrier 510, as in the previous embodiment. The placement and number of fastener clips or pins 530 can vary depending on the materials used for the carrier 510, cover 520, chip 200 and substrate 206, and manufacturing parameters. As in previous embodiments, each cover 520 is configured and dimensioned to permit lateral expansion of each substrate 206 and to provide a third surface (not shown) that acts as a mechanical stop to limit the force and pressure that the cover 520 and carrier 510 apply to the substrate 206. The use of individual covers 520 permits a more uniform force to be applied to each substrate 206 and can provide more consistency in securing each substrate 206 to the carrier 510 thereby providing a more robust manufacturing process and even more improved chip assemblies. It also improves the logistics for quality assurance and reject part management during the assembly process.

Figure 35:
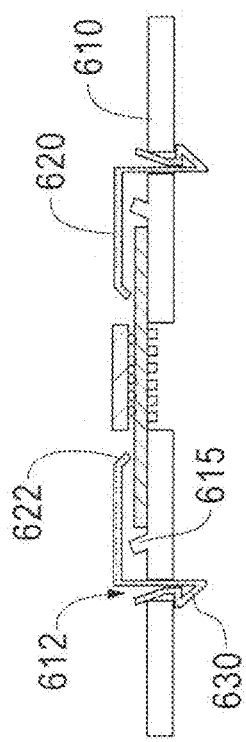
FIG. 35 is a side elevational view in cross-section of a further embodiment of the disclosure.

In yet another embodiment shown in FIG. 35, a carrier 610 can include a plurality of stops 615 that extend upwardly from a top surface 610a of the carrier 610. Each stop 615 can be configured to position each substrate 206 on the carrier 610 while permitting lateral expansion of each substrate 206 when the chip assembly is heated. The stops 615 also may be dimensioned to limit contact between the cover 620 and top surface 206a of the substrate 206. They could be dimensioned to act as mechanical stops to limit the force and pressure that each cover 620 and carrier 610 applies to each substrate 206. The carrier 610 also includes a plurality of apertures 612 configured to receive a clip or pin. Each cover 620 includes a plurality of clips or pins 630 formed integrally with the cover 620, as shown in FIG. 35. Each cover 620 includes extensions 622 that contact a portion of the upper surface 206a of each substrate 206 to resist the bending and warping forces and stresses that occur during the heating and cooling of the chip assembly, for example in a solder reflow process. The extensions may be continuous along an entire inner peripheral edge of each cover 620, or they may be spaced apart, non-continuous extensions. Their dimensions and configurations may be varied depending on the amount and extent of pressure to be applied to each substrate 206 and other manufacturing parameters.

It will be understood by persons skilled in the art that the disclosed methods and apparatuses can be used with a wide variety of chips and substrates that are heated and cooled during the assembly and packaging process. Substrates include organic, ceramic, and silicon carriers.

The methods and apparatuses disclosed herein find particular utility in reducing or preventing distortions such as bending and warping that can occur during assembly of a chip onto a substrate using a heating and cooling process, particularly a solder reflow process. The disclosed methods and apparatuses are also useful for chips or other components that include low-k or ultralow-k materials in the BEOL layers and are bonded to a substrate by a solder reflow process, particularly such a process using a lead-free solder that require higher temperatures. As a result, thermally-induced stress and strain failures of the BEOL layers of the chips can be reduced or prevented.

The disclosed methods and apparatuses also reduce or prevent warping and bending of substrates to which larger chips are connected, particularly coreless substrates. Increased chip size such as VLSI chips and the like creates greater stresses on substrates due to the increased surface area of the connection between such larger chips and their substrates. This is particularly true for chips with low-k or ultralow-k dielectric materials in the BEOL structure of the chip, due to the existence of high DNP (distance from neutral point) issues. The disclosed methods and apparatuses reduce and prevent opens and shorts in chip assemblies.

The disclosed methods and apparatuses also reduce or prevent cracking or delamination in the BEOL structure of a chip, including cohesive failures, by reducing or preventing warping and bending of the substrate, particularly when lead-free solders are used to connect chips to substrates. The disclosed methods and apparatuses can prevent or reduce bending and warping of chips and substrates that are assembled by heating and cooling processes that cause expansion and contraction of chips and substrates.

It will be obvious that the various embodiments of the disclosed methods and apparatuses discussed herein may be varied in many ways. Such variations are not to be regarded as a departure from the spirit and scope of the invention, and all such modifications as would be obvious to one skilled in the art are intended to be included within the scope of the following claims. The breadth and scope of the disclosed methods and apparatuses is therefore limited only by the scope of the appended claims and their equivalents.

The invention claimed is:

1. A method of joining a chip on a substrate, comprising:
   positioning a substrate having a top surface and a bottom surface on a top surface of a carrier;
   positioning a cover on the substrate and the carrier so that the cover contacts at least a portion of the top surface of the substrate and at least a portion of a top surface of the carrier;
   securing the cover to the carrier, wherein the carrier and the cover cooperate to apply pressure to the top surface and the bottom surface of the substrate, said pressure being sufficient to at least reduce distortion but without restricting lateral expansion of the substrate;
   placing a chip onto the substrate after positioning said cover on said substrate;
   bonding the chip to the substrate;
   wherein the substrate expands in a lateral direction during bonding but the substrate does not bend or warp during bonding, and
   wherein the cover is dimensioned such that inside surfaces of the cover parallel to the side edges of the substrate are spaced a distance from the side edges of the substrate to permit lateral expansion of the substrate.

2. The method of claim 1, further comprising a step of removing the cover from the carrier.

3. The method of claim 1, wherein the chip is a flip chip and is bonded to the substrate by a flip chip solder reflow process.

4. The method of claim 1, wherein the chip is bonded to the substrate by a process that requires heating and cooling of the chip and the substrate.

5. The method of claim 1, wherein the carrier engages at least a portion of the bottom surface of the substrate and the cover engages at least a portion of the top surface of the substrate to clamp the substrate between the carrier and the cover.

6. The method of claim 1, wherein the cover is secured to the carrier by screws, pins, clips, or fasteners.

7. The method of claim 1, wherein the cover is secured to the carrier with varying degrees of force to adjust the pressure that the cover and the carrier apply to the substrate.

8. The method of claim 1, wherein the carrier applies a mechanical force to at least a portion of the bottom surface of the substrate and the cover applies a mechanical force to at least a portion of the top surface of the substrate.

9. The method of claim 1, wherein the cover includes a mechanical standoff that limits the amount of pressure that the cover and the carrier apply to the substrate when the cover is secured to the carrier.

10. The method of claim 1, further comprising:
    positioning more than one substrate on a top surface of a carrier, each of said substrates having a top surface and a bottom surface;
    positioning a cover on each of the substrates and the carrier so that the cover contacts at least a portion of the top surface of each of the substrates and at least a portion of a top surface of the carrier;
    securing the cover to the carrier, wherein the carrier and the cover cooperate to apply pressure to the top surface and the bottom surface of each substrate;
    placing a chip onto a top surface of each of the substrates; and
    bonding the chips to each of the respective substrate.

11. A method of making a chip assembly that includes a substrate and a chip, comprising:
    positioning a cover on the substrate so that the cover contacts at least a portion of the top surface of the substrate;
    applying pressure to at least a portion of a top surface and a bottom surface of the substrate, said pressure being sufficient to at least reduce distortion but without restricting lateral expansion of the substrate;
    placing a chip onto the substrate after positioning said cover on said substrate; and
    bonding the chip to the substrate by heating and cooling the chip assembly while maintaining said pressure on at least a portion of the top surface and the bottom surface of the substrate,
    wherein the substrate expands in a lateral direction during bonding but the substrate does not bend or warp during bonding, and
    wherein the cover is dimensioned such that inside surfaces of the cover parallel to the side edges of the substrate are spaced a distance from the side edges of the substrate to permit lateral expansion of the substrate.

12. The method of claim 1, wherein the substrate is an organic substrate.

13. The method of claim 11, wherein the substrate is an organic substrate.

14. The method according to claim 3, wherein said chip comprises a plurality of ball or bump limiting metallurgy contacts that correspond to inputs/outputs of the chip, and a solder bump on each of the ball or bump metallurgy contacts; said substrate comprises a plurality of pads, and wherein said method further comprises placing said chip on said substrate so that said bumps align with respective pads on said substrate.

15. The method of claim 14, which further includes depositing an underfill between the flip chip and substrate and curing the underfill.

16. The method of claim 11, wherein the chip is a flip chip and is bonded to the substrate by a flip chip solder reflow process.

17. The method according to claim 16, wherein said chip comprises a plurality of ball or bump limiting metallurgy contacts that correspond to inputs/outputs of the chip, and a solder bump on each of the ball or bump metallurgy contacts; said substrate comprises a plurality of pads, and wherein said method further comprises placing said chip on said substrate so that said bumps align with respective pads on sais substrate.

18. The method of claim 15, which further includes depositing an underfill between the flip chip and substrate and curing the underfill.

* * * * *